United States Patent
Wang (10) Patent No.: US 7,142,610 B1
(45) Date of Patent: *Nov. 28, 2006

(54) M-ARY QUADRATURE AMPLITUDE MODULATION (QAM) BIT-BOUNDARY TURBO CODED SYSTEM

(75) Inventor: Charles C. Wang, Alhambra, CA (US)

(73) Assignee: The Aerospace Corporation, El Segundo, CA (US)

( * ) Notice: Subject to any disclaimer, the term of this patent is extended or adjusted under 35 U.S.C. 154(b) by 716 days.

This patent is subject to a terminal disclaimer.

(21) Appl. No.: 10/462,962

(22) Filed: Jun. 17, 2003

(51) Int. Cl.
*H04L 23/02* (2006.01)
*H04L 27/06* (2006.01)
*H03M 13/03* (2006.01)

(52) U.S. Cl. .................. 375/262; 375/341; 714/794
(58) Field of Classification Search ................ 375/262, 375/341, 261, 279; 714/794, 795, 790
See application file for complete search history.

(56) References Cited

U.S. PATENT DOCUMENTS 6,611,940 B1 * 8/2003 Markarian et al. .......... 714/790
6,904,555 B1 * 6/2005 Nagase et al. .............. 714/751
2004/0203705 A1 * 10/2004 Lundby .................. 455/422.1

* cited by examiner

Primary Examiner—Khai Tran
(74) Attorney, Agent, or Firm—Derrick Michael Reid

(57) ABSTRACT

A turbo coded communication system includes a gray scale mapper in a transmitter for generating a symbol constellation of modulated signals points that can be separated by boundary lines in the constellation space into bitwise groups of zero bits and one bits where the shortest distance from a boundary line to received value in the constellation space indicates the bitwise soft metrics that is computed using a set of bitwise soft metric equations are a function of the minimum distance using closed form algebraic equations in turbo decoding receiver. In the case of quadrature amplitude modulation (QAM), the bit boundary lines are predetermined by a minimum distance in the constellation space for a specified M-ary modulation, so that, the soft metric equations are only a function of the received signal value for providing efficient computation of the bitwise soft metric.

14 Claims, 7 Drawing Sheets

M-ARY PSK & QAM BIT-BOUNDARY TURBO CODED SYSTEM

M-ARY PSK & QAM BIT-BOUNDARY TURBO CODED SYSTEM

FIG. 1

16-ARY QAM BIT-BOUNDARY GRAY MAPPING

FIG. 2A

64-ARY QAM BIT-BOUNDARY GRAY MAPPING

FIG. 2B

8-ARY PSK BIT-BOUNDARY GRAY MAPPING

FIG. 3A

16-ARY PSK BIT-BOUNDARY GRAY MAPPING

FIG. 3B

QAM BER PERFORMANCE

FIG. 4

PSK BER PERFORMANCE

FIG. 5

M-ARY QUADRATURE AMPLITUDE MODULATION (QAM) BIT-BOUNDARY TURBO CODED SYSTEM

STATEMENT OF GOVERNMENT INTEREST

The invention was made with Government support under contract No. F04701-00-C-0094 by the Department of the Air Force. The Government has certain rights in the invention.

REFERENCE TO RELATED APPLICATION

The present application is related to applicant's copending application entitled M-Ary Phase Shift Keying (PSK) Bit-Boundary Turbo Coded System Ser. No. 10/462,987, filed Jun. 17, 2003, by the same inventor.

FIELD OF THE INVENTION

The invention relates to the field of turbo coded communication systems. More particularly, the present invention relates to gray code mapping during transmission and bit boundary metric determinations during reception for improved performance in phase shift keying (PSK) modulation and quadrature amplitude modulation (QAM) turbo coded communication systems.

BACKGROUND OF THE INVENTION

Communication system performance is enhanced by both power and bandwidth efficiencies. Since 1993, turbo codes have been shown to be powerful forward error correction codes that enhance communication system performance. Many commercial communication systems use turbo codes as standards through the development of standard turbo codeces. Although a significant amount of coding gain can be achieved, the binary turbo codes do not have good bandwidth efficiency due to low code rates unless heavily punctured with additional coding bits. Heavily punctured turbo coding results in bit-error-rate (BER) performance degradation. Conventional approaches to improving bandwidth efficiencies are to adopt turbo trellis coded modulation (TTCM). For most TTCM structures, each modulated symbol corresponds to a state transition during modulation where a respective metric is computed for each received symbol during reception. A TTCM system can provide good turbo code performance without bandwidth expansion. However, a TTCM system requires a different code structure than a conventional binary turbo code. Each unique turbo code design results in an expensive new codec development.

One way to attain both power and bandwidth efficiencies is to adopt high-order modulation schemes with a binary turbo code. An alternative to a TTCM structure for obtaining both power and bandwidth efficiency is to adopt high-order nonbinary modulation such as M-ary phase shift keying (PSK) modulation or M-ary quadrature amplitude modulation (QAM). High-order nonbinary modulation structures include, for examples, the commonly used 8-ary PSK or 16-ary PSK, with a commonly used binary turbo code, or for examples, the commonly used 16-ary QAM, or 64-ary QAM, with a commonly used binary turbo code. These high-order nonbinary modulation methods require a conversion of demodulator output that is associated with the nonbinary channel symbol into bit metrics as inputs to the binary turbo decoder. The advantage of M-ary nonbinary modulation is that no new codec development is required because the binary turbo codeces are commercially available. However, the problem with M-ary nonbinary modulation is the need to implement improved methods of forming the bitwise decoding metrics on binary bits from the nonbinary demodulator. For most TTCM structures, each modulated symbol has a state with a transition from one state to another state defining a metric distance. The maximum likelihood metric, which is associated with the minimum Euclidean distance, is formed at the demodulator and used for turbo decoding. However, for the binary turbo coding, the bitwise metrics must be formed for turbo decoding.

One way to form the bitwise decoding metrics from a PSK or a QAM demodulator is to use the maximum likelihood metric that is the optimum one for uncoded demodulation as widely used. Unfortunately, forming this metric requires complex circuitry and knowledge of channel condition, which is sometimes unavailable. More importantly, this decoding metric gives inferior bit-error-rate (BER) performance to the TTCM system. A puncturing approach is applied to a trellis coded modulation using a turbo coding, such as a rate (m−1)/m binary convolutional code punctured from an optimum and widely used rate 1/2 convolutional code followed by a $2^L$-ary PSK or QAM modulation, where L is the number of bits in a symbol. A property of this puncturing approach is that a complicated mapping is used for the signal constellation. Common puncturing converts a commonly used turbo code into a rate turbo code of rate m'/m, where m'<m, for an $2^L$-ary high order binary modulation. A gray code approach can be used where gray code mapping defines a signal constellation space and can be used during turbo coding that also utilizes puncturing for improved bandwidth efficiency. However, when m'/m is greater than 1/2, more than 50% of parity check bits need to be discarded, which can cause additional BER degradation. These and other disadvantages are solved or reduced using the invention.

SUMMARY OF THE INVENTION

An object of the invention is to provide a soft metric generator using boundary lines within the symbol constellation space for encoded symbols in a turbo code communication system.

Another object of the invention is to provide a soft metric generator using boundary lines within the symbol constellation space for gray code encoded symbols in a turbo code communication system using quadrature amplitude modulation.

Yet another object of the invention is to provide a soft metric generator using boundary lines within the symbol constellation space for gray code encoded symbols in a turbo code communication system using phase shift keying modulation.

The invention is directed to a turbo code communication system that forms bit boundary turbo decoding metrics for M-ary waveforms. A first aspect of the invention is directed to forming bit boundary turbo decoding metrics for M-ary quadrature amplitude modulation (QAM) waveforms. A second aspect of the invention is directed to forming of bit boundary turbo decoding metrics for M-ary phase shift keying (PSK) waveforms. The bit boundary metrics determinations can be directly implemented without prior knowledge of channel condition. The bit boundary metrics provide improved bit error rate (BER) performance.

In the preferred form, an input data stream is passed through a conventional turbo encoder providing turbo encoded data that is then mapped through a mapper, such as a gray scale mapper, prior to M-ary modulation and communication of channel symbols over an additive white Gaussian noise channel. The received channel symbols are demodulated by an M-ary demodulator into demodulated received quadrature signals that are fed into a soft metric generator generating gray scale bit boundary soft metrics that are then fed into a turbo decoder for generating an estimate of the original bit stream for effective M-ary turbo coding communications.

In a preferred form, a rate 1/2 binary punctured turbo code from the commonly used rate 1/3 turbo code is used. The bandwidth efficiency is achieved by directly cascading a power-efficient rate 1/2 binary turbo code with high-order PSK or QAM modulations. Conventionally, the maximum likelihood metric that is associated with the shortest Euclidean distance, is formed by the soft metric generator and then used for turbo decoding. The bitwise soft metrics are generated for conventional turbo decoding. The use of gray scale encoding in the transmitter enables a computationally efficient soft metrics generator in the receiver using bit boundaries in the signal constellation space. The computation of the soft metrics is reduced to a closed form algebraic computation. Gray scale encoding determines the bit boundaries within the symbol constellation space. The algebraic equations are used to determine shortest distances between the demodulated received signal to the bit boundaries for generating the bitwise soft metrics. The gray scale encoding defines signal symbol points within the symbol constellation space and defines a minimum distance $\delta$ for a quadrature amplitude modulation (QAM) turbo communication system in the first aspect of the invention, or provides a minimum angle $\alpha$ for a phase shift keying (PSK) modulation turbo communication system in the second aspect of the invention. The use of gray scale mapping enables the generation of a plurality of bitwise predetermined algebraic equations in the soft metrics generator. In the first aspect of the invention using QAM, the soft metric generator receives the demodulated received signal and computes the bitwise soft metrics using the predetermined minimum distance $\delta$ and the predetermined bitwise algebraic equations. In a second aspect of the invention using PSK modulation, the bitwise soft metrics generator receives the demodulated received signal and computes the bitwise soft metrics using the predetermined minimum angle $\alpha$ and predetermined bitwise algebraic equations.

In two preferred forms of the first aspect, 16-ary QAM and 64-ary QAM predetermined distances and the predetermined algebraic equations are specified for direct implementation into the soft metrics generator in a QAM turbo communication system, without loss of generality. In two other preferred forms of the second aspect of the invention, 8-ary PSK and 16-ary PSK predetermined minimum angles and the predetermined algebraic equations are specified for direct implementation into the soft metric generator in a PSK modulation turbo communication system, without loss of generality. The preferred gray scale encoding provides improved BER performance with efficient soft metrics computations. The invention can be applied to various communication systems, including direct broadcasting, personal communications, and satellite communications. These and other advantages will become more apparent from the following detailed description of the preferred embodiment.

DETAILED DESCRIPTION OF THE PREFERRED EMBODIMENT

Figure 1:
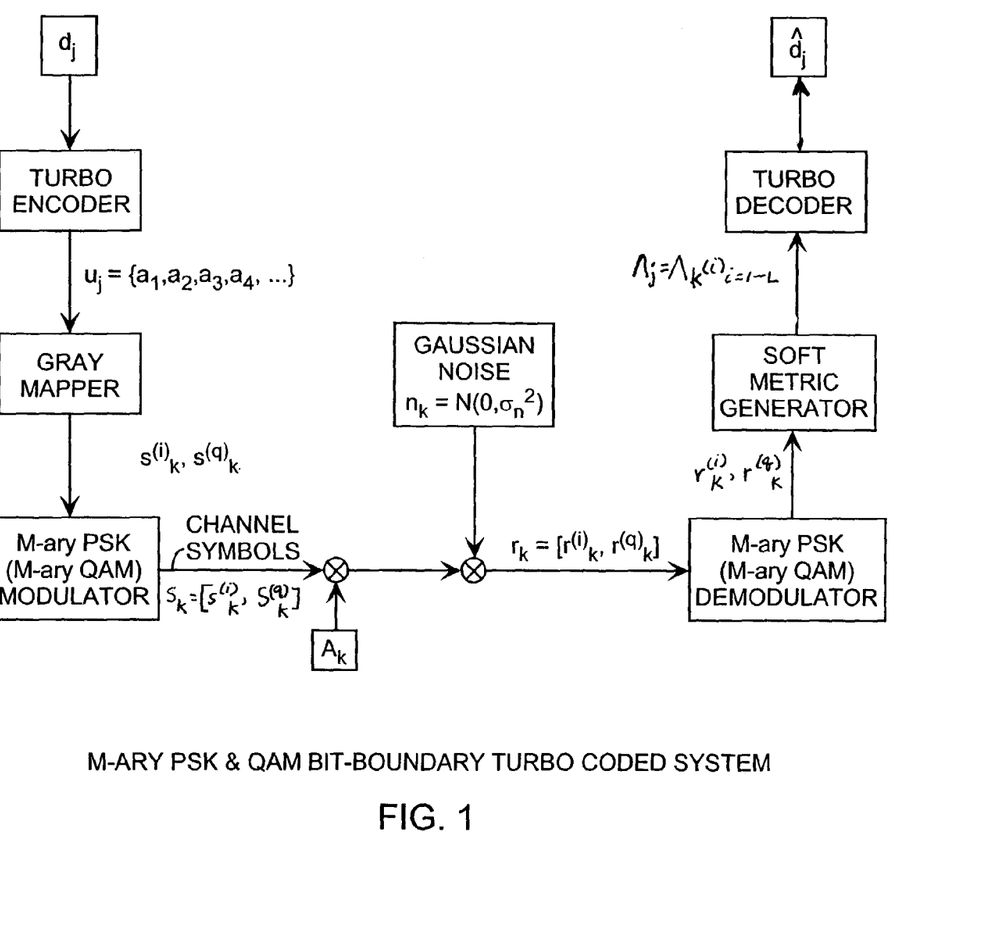
FIG. 1 is a block diagram of a phase shift keying (PSK) modulation or quadrature amplitude modulation (QAM) bit boundary turbo coded communication system.

An embodiment of the invention is described with reference to the figures using reference designations as shown in the figures. Referring to FIG. 1, an M-ary phase shift keying (PSK) modulation or quadrature amplitude modulated (QAM) gray-scale bit-boundary turbo-coded communication system has improved power and bandwidth efficiency for communicating an input data stream $d_j$. The input data stream $d_j$ is fed into a conventional binary turbo encoder. The turbo encoder may include two recursive convolutional encoders concatenated in a parallel along with an internal interleaver, all not shown, on the source data bits as a conventional turbo encoder. For example, turbo encoding the original data bits $d_j$ is preferably accomplished using a rate 1/3 turbo encoder consisting of two recursive systematic encoders for generating polynomial $(23,35)_8$ in a parallel concatenated configuration with an S-random interleaver that is used to separate the input bits in the recursive convolutional encoders. A puncturing pattern is used to alternately delete the parity check bits from two recursive systematic encoders to make the turbo code rate 1/2, with an S-random interleaver size of 1024 with S=17, where S is the conventional S-random interleaver parameter.

The turbo encoder provides turbo encoded data $U_j=\{a_1, a_2, a_3, a_4, \ldots, a_i\}$ of $a_i$ bits. The encoded data $U_j$ is then mapped through a mapper, such as a gray scale mapper, into turbo-coded mapped symbols $S_k$ that is fed into an M-ary modulator for generating a channel signal that is communicated over an additive white Gaussian noise channel providing noise components $n_k$, where j in the input bit index and k is the symbol index. The received signal $r_k$ is demodulated by an M-ary demodulator into I and Q quadrature received signals. The M-ary modulator is an M-ary PSK or QAM modulator, and the M-ary demodulator is an M-ary PSK or QAM demodulator, respectively. The M-ary demodulator demodulates the received signal $r_k$ into demodulated quadrature signals, including the demodulated inphase received signal $r^{(i)}_k$ and the demodulated quadrature received signal $r^{(q)}_k$ that are both fed into a soft metric generator for generating gray-scale bit-boundary soft bitwise metrics $\Lambda_j$ that are generated for each bit $a_i$ of each k symbol such that $\Lambda_j$ is a sequence of bitwise metrics for each $k^{th}$ symbol, that is, $\Lambda_j=\Lambda_k(i)$ for $i=1, \ldots, L$, where L is the order of modulation, such that $2^L=M$. The bit wise soft metrics $\Lambda_j$ are fed into a turbo decoder that provides an estimate $\hat{d}_j$ of the original data stream $d_j$ for power and bandwidth efficient turbo coded communications.

Figure 2A:
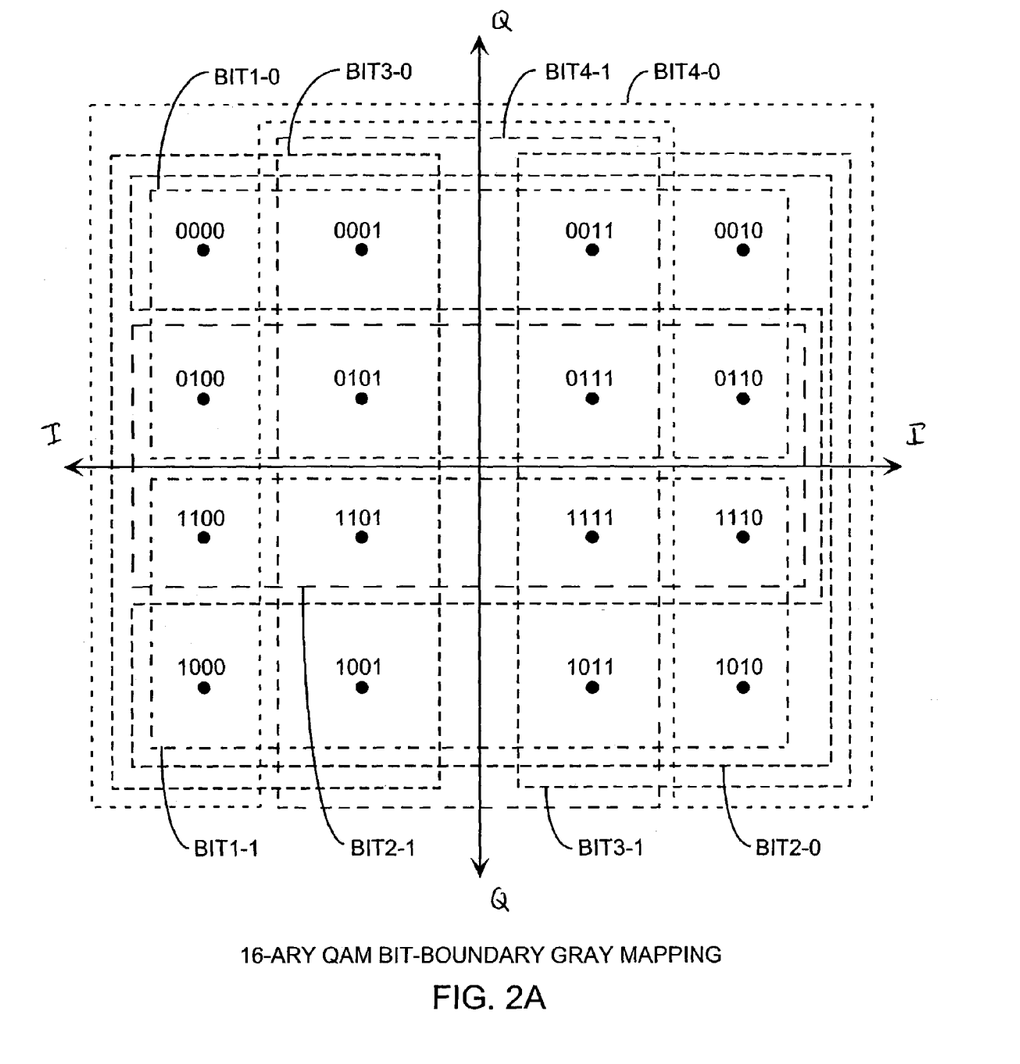
FIG. 2A depicts 16-ary QAM bit boundary gray scale mapping.
Figure 2B:
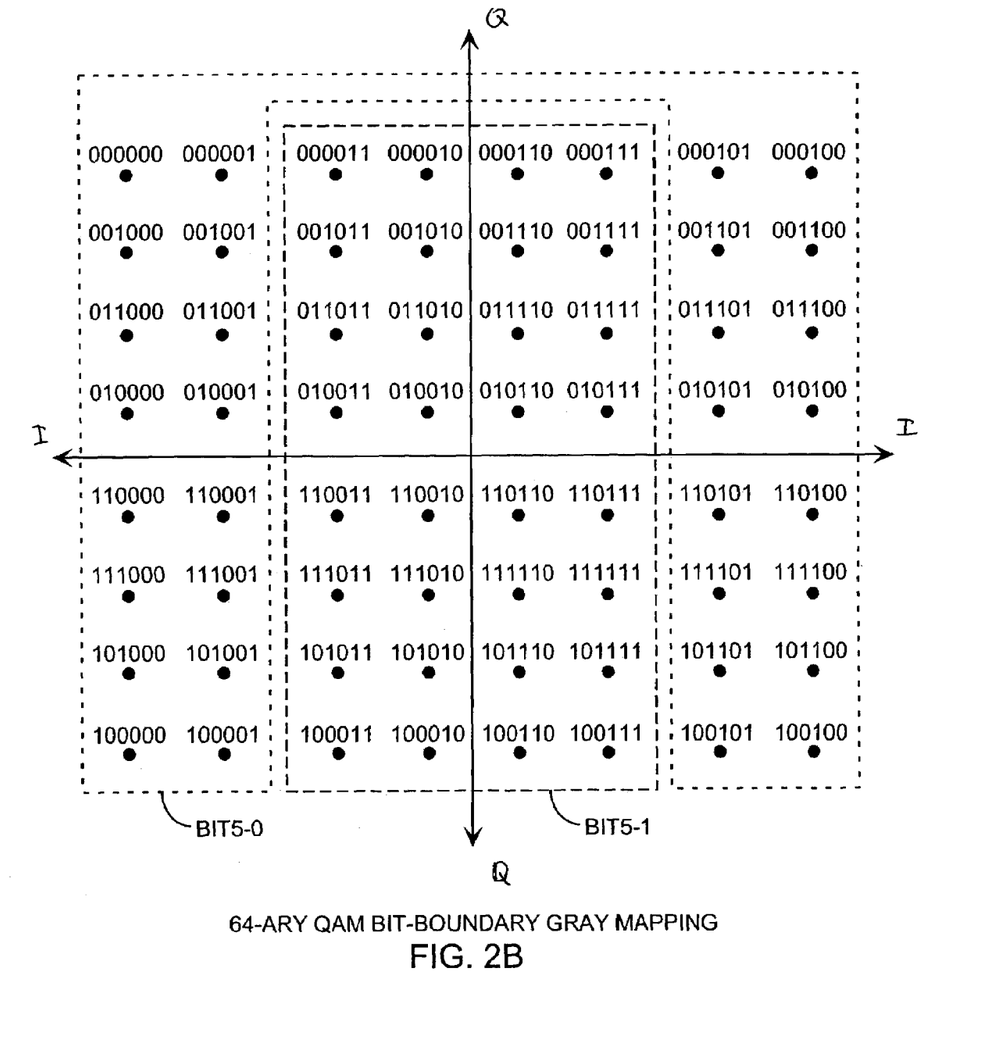
FIG. 2B depicts 64-ary QAM bit boundary gray scale mapping.
Figure 3A:
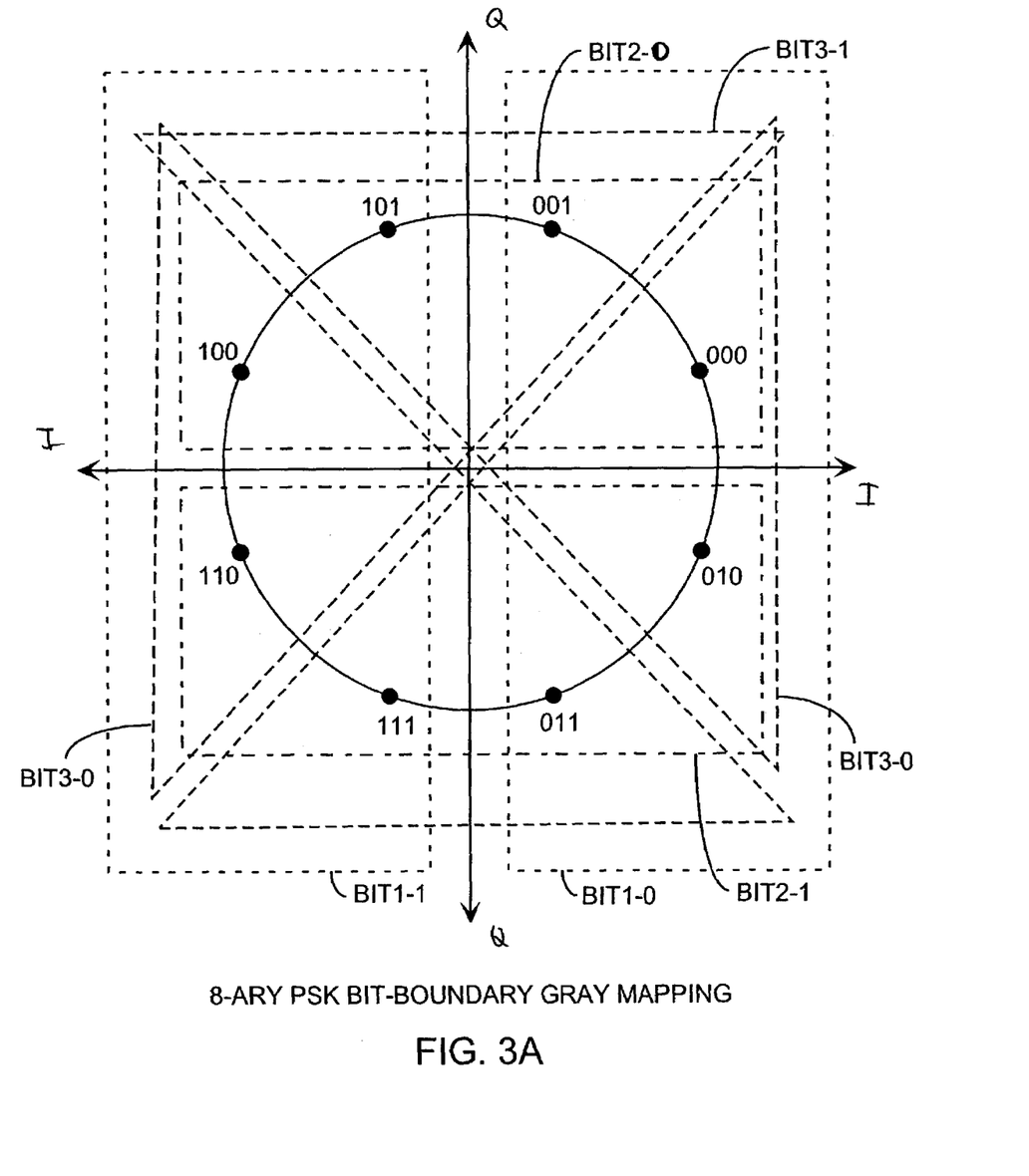
FIG. 3A depicts 8-ary PSK bid boundary gray scale mapping.
Figure 3B:
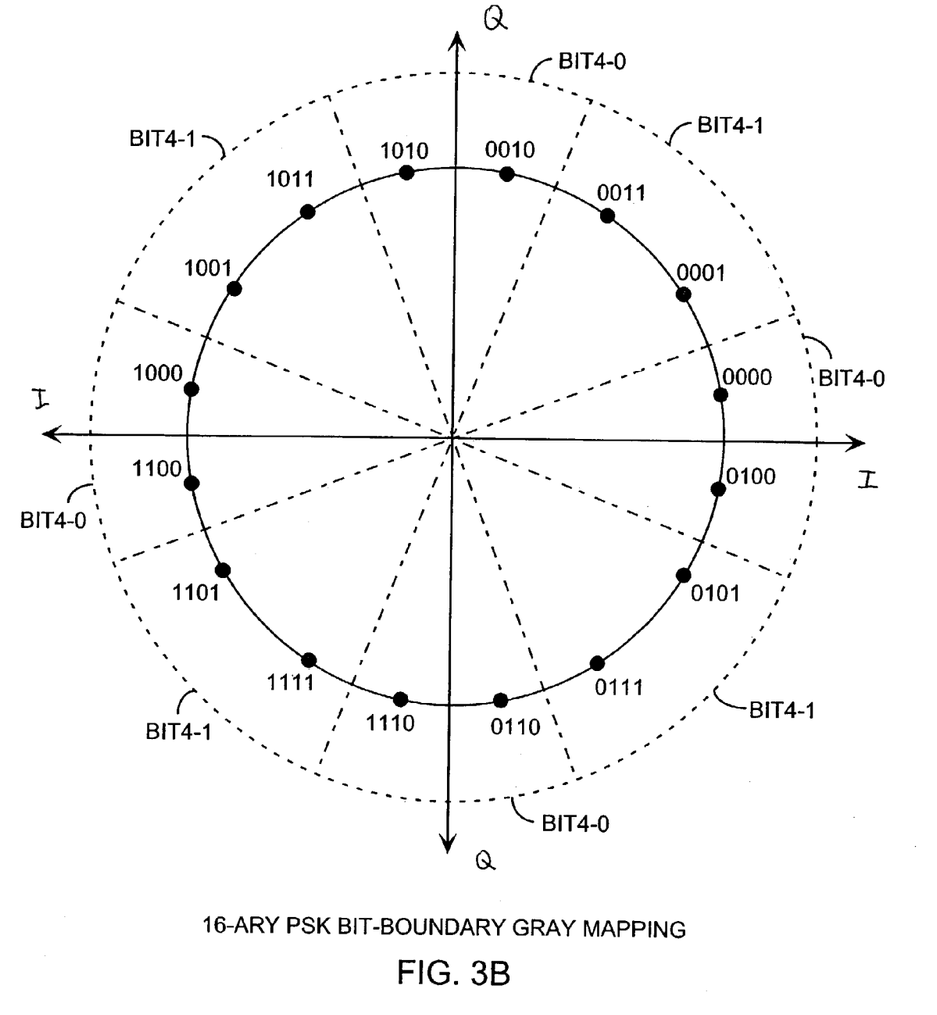
FIG. 3B depicts 16-ary PSK bid boundary gray scale mapping.

In an 8-ary mapper, every three consecutive coded bits, including systematic and parity-check bits, are denoted as $[a_1, a_2, a_3]$, where the order L equals 3 and bit index i equals, 1, 2 or 3, and are grouped together and gray scale mapped to one of eight symbols within a 8-ary symbol constellation space. Likewise and in a 16-ary mapper, every four consecutive coded bits, including systematic and parity-check bits, are denoted as $[a_1, a_2, a_3, a_4]$, and are grouped together and gray scale mapped to one of 16 symbols within a 16-ary symbol constellation space. Likewise and in a 64-ary mapper, every six consecutive code bits, including systematic and parity-check bits, are denoted as $[a_1, a_2, a_3, a_4, a_5, a_6]$, and are grouped together and gray scale mapped to one of 64 symbols within a 64-ary symbol constellation space. Any M-ary mapper can be used, though in the exemplar forms, 8-ary PSK, 16-ary PSK, 16-ary QAM, and 64-ary QAM gray scale mappers are preferred. A 16-ary gray scale QAM symbol constellation space is shown in FIG. 2A. A 64-ary gray scale QAM symbol constellation space is shown in FIG. 2B. A 8-ary gray scale PSK symbol constellation space is shown in FIG. 3A and a 16-ary gray scale PSK symbol constellation space is shown in FIG. 3B. For channel description, the term $[x(j),y(j)]$ denotes the transmitted I and Q signals associated with each symbol, where $j=1, \ldots, M$ for M-ary-$2^L$-ary, with L equal to 3 for 8-ary signaling, with L equal to 4 for 16-ary signaling, and with L equal to 6 for 64-ary signaling. Without loss of generality, the average transmitted power is set to be unity. With each coded bit having an equal probability 0 or 1, the probability summation of I and Q signal equals to 1 as defined by a probability equation.

$$\sum_{j=1}^{M} [x(j)^2 + y(j)^2]/M = 1$$

The channel is modeled as an additive white Gaussian noise channel. On the receiver side, using baseband equivalent representation, the demodulated received I and Q signals at symbol time k can be expressed by I and Q quadrature equations.

$r^{(i)}_k = s^{(i)}_k + n^{(i)}_k$ $r^{(q)}_k = s^{(q)}_k + n^{(q)}_k$

In the quadrature equation, $s^{(i)}_k$ and $s^{(q)}_k$ are respectively one of the $M \times(j)$ and $y(j)$ values, and $n^{(i)}_k$ and $n^{(q)}_k$ are independent zero-mean normally distributed random variables with a variance σ defined by a variance equation.

$$\sigma_n^2 = \frac{1}{2 \cdot (E_s/N_0)}$$

In the variance equation, $E_s$ is the actual average symbol energy and $N_0$ is the power density function (PDF) of the white Gaussian noise. The communication channel can be modeled as a Rayleigh fading channel with additive white Gaussian noise. On the receiver side, using baseband equivalent representation, the received I and Q signals at symbol time k can be expressed by I and Q receiver equation.

$r^{(i)}_k = A^{(i)}_k \cdot s^{(i)}_k + n^{(i)}_k$ $r^{(q)}_k = A^{(q)}_k \cdot s^{(q)}_k + n^{(q)}_k$ In the I and Q receiver equations, $A^{(i)}_k$ and $A^{(q)}_k$ are Rayleigh distributed with unity power, $s^{(i)}_k$ and $s^{(q)}_k$ are respectively one of the $M \times(j)$ and $y(j)$ values, and $n^{(i)}_k$ and $n^{(q)}_k$ are independent zero-mean normally distributed random variables with variance σ defined by variance equation.

Soft bit metrics are required for turbo decoding. The I and Q demodulated received signals from the PSK or QAM demodulator is fed into the soft metrics generator. There are various computation methods that can be used for forming turbo decoding PSK or QAM soft metrics. A prior art first method of forming a PSK or QAM soft metric out of the PSK or QAM demodulator is through the use of a logarithm likelihood ratio associated with each bit of a channel symbol as described in a logarithm likelihood ratio soft metric equation.

$$\Lambda_k(n) = \text{Log} \frac{\sum_{j=1; a_n=1}^{M} \exp\left\{-\frac{1}{2\sigma_n^2}\left[(r_k^{(i)} - x(j))^2 + (r_k^{(q)} - y(j))^2\right]\right\}}{\sum_{j=1; a_n=0}^{M} \exp\left\{-\frac{1}{2\sigma_n^2}\left[(r_k^{(i)} - x(j))^2 + (r_k^{(q)} - y(j))^2\right]\right\}}$$

In the logarithmic likelihood ratio soft metric equation, $n=1, \ldots, L$. The soft metric term $\Lambda_k(n)$ requires the channel side information (CSI) $E_s/N_0$. The channel side information is computationally complex and variable over time.

A prior art second method of forming PSK or QAM soft bit metrics out of a PSK or QAM demodulator is to use the maximization function that replaces the summation in the numerator and denominator in the logarithm likelihood ratio soft metric equation, reflecting a high SNR approximation. Then, the bit soft metric for bit position n, for $1 \leq n \leq L$, is described in a modified logarithm likelihood ratio soft metric equation.

$$\Lambda_k(n) = \text{Log} \frac{\underset{j=1; a_n=1}{\overset{M}{\text{MAX}}}\left[\exp\left\{-\frac{1}{2\sigma_n^2}\left[(r_k^{(i)} - x(j))^2 + (r_k^{(q)} - y(j))^2\right]\right\}\right]}{\underset{j=1; a_n=0}{\overset{M}{\text{MAX}}}\left[\exp\left\{-\frac{1}{2\sigma_n^2}\left[(r_k^{(i)} - x(j))^2 + (r_k^{(q)} - y(j))^2\right]\right\}\right]}$$

$$= \underset{j=1; a_n=1}{\overset{M}{\text{MAX}}}\left[-\frac{1}{2\sigma_n^2}\left[(r_k^{(i)} - x(j))^2 + (r_k^{(q)} - y(j))^2\right]\right] -$$

$$\underset{j=1; a_n=0}{\overset{M}{\text{MAX}}}\left[-\frac{1}{2\sigma_n^2}\left[(r_k^{(i)} - x(j))^2 + (r_k^{(q)} - y(j))^2\right]\right]$$

This modified logarithm likelihood ratio soft metric equation soft metric also requires computation of the CSI.

A preferred new third method of forming a soft metrics is a bit boundary soft metric computation method. For the case of QAM, the symbol constellation space has points defined by rectangular x-y coordinates that directly translate into the I and Q received signal coordinates. In the signal constellation space defining the signal space for QAM shown in FIG. 2A, for each bit position $a_1$, $a_2$, $a_3$, and $a_4$, there is a $bit_1$ boundary, a $bit_2$ boundary, a $bit_3$ boundary, and $bit_4$ boundary. Each bit boundary is a line that separates all pairs of points that have 0 and 1 at a respective bit position. These bit boundaries effectively group half of the points for each bit position $a_i$, one group including points with ones in the $a_i$ bit position and the other group including points with zeros in the $a_i$ bit position. For example, in FIG. 2A, there are eight groupings, with the $bit_1$ boundary between groups $bit_{1-0}$ and $bit_{1-1}$, with an $bit_2$ boundary between groups $bit_{2-0}$ and $bit_{2-1}$, a $bit_3$ boundary between groups $bit_{3-0}$ and $bit_{3-1}$, and a $bit_4$ boundary between groups $bit_{4-0}$, and $bit_{4-1}$. For the 64-ary QAM symbol constellation space shown in FIG. 2B, only two groupings are shown, group $bit_{5-0}$ and group $bit_{5-1}$, for convenience, for the $a_5$ bit position. For each pair of groups of signal points that are associated with a bit position, there always exists one a bit boundary in the signal space that separate the pairs of $bit_i$-0 and $bit_i$-1 groups of signal points. The bit boundary bisecting of zero and one groups using straight-line $bit_i$ bit boundaries is a result of the preferred gray scale mapping. Hence, the signal constellation space points are separated into $bit_i$-0 and $bit_i$-1 groups by $i^{th}$ bit boundaries. The straight line $bit_i$ bit boundaries can be designated by a y value or an x value in the constellation space for the preferred gray scale mapping. For examples, in the QAM signal space, the inphase horizontal i-axis where q=0 bisects the $bit_{1-0}$ and $bit_{1-1}$ groups, and quadrature vertical q-axis where i=0 bisects the $bit_{3-0}$ and $bit_{3-1}$ groups. All $bit_{i-0}$ and $bit_{i-1}$ groups for 16-ary QAM are shown in FIG. 2A, and only one such group for 64-ary QAM is shown in FIG. 2B.

To satisfy the probability equation and to generate soft metric equations, the smallest magnitude in symbol constellation space, that is, the minimum distance $\delta$, from any signal point to the inphase i-axis or quadrature q-axis in either I or Q channels, respectively, among all symbol points, is used. The minimum distance $\delta$ is $1/\sqrt{10}$ for 16-ary QAM. The minimum distance $\delta$ is $1/\sqrt{42}$ for 64-ary QAM. The minimum distance $\delta$ can be used to define a point position or a bit boundary in the constellation space. For example, the i and q position values of symbol point {0,1,1,0} is at i=3$\delta$ and q=$\delta$, and there is a $bit_4$ boundary line at i=±2$\delta$. That is, the gray scale mapping enables the division of the symbol constellation space by bit boundaries for respective bits $a_i$, for separating the constellation space into two groups of points having 0 or 1 bit values for the respective bit $a_i$, in the respective bit position, so that, for each bit $a_i$, the constellation space is separated into a group of 0 bit values and a group of 1 bit values. That is, the bit boundaries separate 0 and 1 bit value groups of points. Using the gray scale mapping, the bit boundary lines extend in parallel to either the i-axis at a q-axis at values being multiples of the minimum distance $\delta$. As such, the bit boundary always extends between adjacent point pairs of 0 and 1 values for the respective bit position. The received signals are the received points in terms of x-i and y-q constellation space values, and, the bitwise soft metric $\Lambda$ is computed as the minimum spatial distance from the receive point to a bit boundary that separates zero and one bit values for the respective bit position. The bitwise soft metrics $\Lambda$ is computed using soft metric equations, one for each bit position. As such, and significantly, the soft metric $\Lambda$ is only a function of the demodulated received signal value $r_k$ and the minimum distance $\delta$ in the constellation space.

In the case of 16-ary QAM, for example as shown in FIG. 2A, $bit_{1-0}$ and $bit_{1-1}$ groups of points have a $bit_1$ boundary line that extends along the inphase i-axis at q=0. That is, the $bit_1$ boundary, which extends between the 0 and 1 values of the first bit $a_1$, extends along the inphase i-axis. Hence, the distance from the received signal to the $bit_1$ boundary line for the first bit $a_1$ is the distance from the received signal in quadrature $r^{(q)}$ to the inphase i-axis, and hence, the soft metric is $\Lambda_k(1)=-r^{(q)}_k$, that is, the negative value of the received signal in quadrature. All of the 1 values for bit $a_1$ are below the i-axis, and hence, the receive value in quadrature is negative. The negative sign in the soft metric $\Lambda_k(1)= -r^{(q)}_k$ changes the sign of the received signal so that all 1 values have a positive value. Oppositely, all positive received values of $r^{(q)}$ are above the i-axis, and the negative sign in the soft metric $\Lambda_k(1)=-r^{(q)}_k$ would provide a negative value, and hence, the sign of the soft metric $\Lambda_k(1)=-r^{(q)}_k$ computed value would indicate a 0 or 1 bit value, whereas the absolute value of the soft metric provides an indication of the probability of being a 0 or 1 bit value. As such, the Euclidean distances of the received signal perpendicular to the boundary lines represent reliability information for the corresponding received bit value especially in the presence of a high SNR. Therefore, with proper signs, the computed distances to a bit boundary can be used as the decoding soft metric and is efficiently computed.

In the case of the second bit $a_2$, as another example, the $bit_2$ boundary extends horizontally at q=±2$\delta$, that is, between the top two rows and between the bottom two rows, where the second bit value changes between 0 and 1. The soft metric distance from a received point to the bit boundary is 2$\delta$ minus the received value in quadrature $r^{(q)}$, that is, the $a_2$ soft metric is $\Lambda_k(2)=2/\sqrt{10}-|r^{(q)}_k|$, where $\delta=1/\sqrt{10}$. In the case of the third bit $a_3$, the $bit_3$ boundary extends vertically along the quadrature q-axis at i=0. For the third bit $a_3$, the soft metric is the distance from the inphase received point $r^{(i)}$ to the quadrature q-axis that is the $bit_3$ boundary. The soft metric for bit $a_3$ is $\Lambda_k(3)=r^{(i)}_k$. The $bit_4$ boundaries extend vertically at x=±2$\delta$, that is, between the first and second columns and between the third and fourth columns. For the fourth bit $a_4$, the soft metric inphase distance is $\Lambda_k(4)=2\delta-|r^{(i)}k|$, that is, $\Lambda_k(4)=2/\sqrt{10}-|r^{(i)}k|$. Hence, for 16-ary QAM, the soft metrics are computed as $\Lambda_k(1)=-r^{(q)}_k$, $\Lambda_k(2)=2/\sqrt{10}-|r^{(q)}_k|$, $\Lambda_k(3)=r^{(i)}_k$, and, $\Lambda_k(4)=2/\sqrt{10}-|r^{(i)}k|$.

The simplicity of these soft bit metric equations extends from the preferred gray scale mapping defining bit boundaries and from the computation of the distance from the received point in quadrature to the i-axis or the received point inphase to the q-axis. Using gray scale mapping, the vertical bit boundaries are intersected by the inphase i-axis and horizontal bit boundaries are intersected by the quadrature q-axis, that then enables derivation of the soft metric equations based only on the minimum distance $\delta$ and the inphase or quadrature received signal value in the constellation space. The minimum distance of the constellation space and the inphase or quadrature value of the received signal are all that is needed to compute the soft metric. These soft bit metrics computations do not require complicated CSI computations nor approximations, and can be readily implemented in the soft metric generator.

In the case of 64-ary QAM having a signal space as shown in FIG. 2B, the process of computing the soft metric remains the same in generating simple soft metric equations. The minimum distance $\delta$ and the inphase or quadrature value of the received signal are again applied to simple computation soft metric equations where the sign of the result indicates a zero or one value and the magnitude is the reliability indicator. The minimal spatial distance to the first point is $\delta$. For example, the point 010110 has a coordinate location of i=$\delta$ and q=$\delta$. The minimum absolute spatial distance from this point to either the i-axis or q-axis is $\delta$. Again, for each bit position $a_i$, there is a $bit_i$ boundary separating groups of 0 and 1 bit values. For example, the $bit_5$ boundaries extends between the second and third columns and between the sixth and seventh columns, separating the signal constellation space into two groups $bit_{5-0}$ and $bit_{5-1}$, as conveniently shown in FIG. 2B. The $bit_5$ boundary is $i\pm4\delta$. All $bit_i$ boundaries can be specified in terms of i-axis and q-axis location as a function of the minimum distance $\delta$. For 64-ary QAM, the gray scale constellation space also indicates that the inphase i-axis bisects vertical boundaries and that the quadrature q-axis bisects horizontal boundaries. The inphase or quadrature value of the received signal and minimum distance $\delta$ is all that is needed for computing the soft metric using the soft metric equations.

For 64-ary QAM, the $bit_1$ boundary is between $a_1$ bit position for $bit_{1-0}$ group and $bit_{1-1}$ group, and extends along the i-axis at $q=\pm0\delta=0$. The $bit_2$ boundary line is between the $a_2$ bit position for 0 and 1 bit values, and extends horizontally at $q=\pm4\delta$. The $bit_3$ boundary is between the $a_3$ bit position for 0 and 1 bit values, and extends horizontally at $q=\pm2\delta$ and $q=\pm6\delta$. The $bit_4$ boundary is between the $a_4$ points whose $a_4$ bit positions have 0 and 1 values, and extends vertically at $i=\pm0\delta=0$. The $bit_5$ boundary is between the $a_5$ points whose $a_5$ bit positions have 0 and 1 values, and extends vertically at $x=\pm4\delta$. The $bit_6$ boundary is between the $a_6$ points whose $a_6$ bit positions have 0 and 1 values, and extends vertically at $x=\pm2\delta$ and $x=\pm6\delta$. Hence, for 64-ary QAM, $\Lambda_k(1)=-r^{(q)}_k$, $\Lambda_k(2)=4\sqrt{42}-|r^{(q)}_k|$, $\Lambda_k(3)=2\sqrt{42}-|(|r^{(q)}_k|-4\sqrt{42})|$, $\Lambda_k(4)=r^{(i)}_k$, $\Lambda_k(5)=4\sqrt{42}-|r^{(i)}_k|$, and, $\Lambda_k(6)=2\sqrt{42}-|(|r^{(i)}_k|-4\sqrt{42})|$. Using the preferred gray scale mapping applied to QAM, the vertical bit boundaries are intersected by the inphase i-axis and horizontal bit boundaries are intersected by the quadrature q-axis, that then enables derivation of the soft metric equations based only on the minimum distance $\delta$ and the demodulated received signal value $r_k$ for ease of computation of the soft metric having a metric sign indicating a zero or one bit value and having a metric magnitude indicating the probability of being a zero or one bit, respectively.

Figure 4:
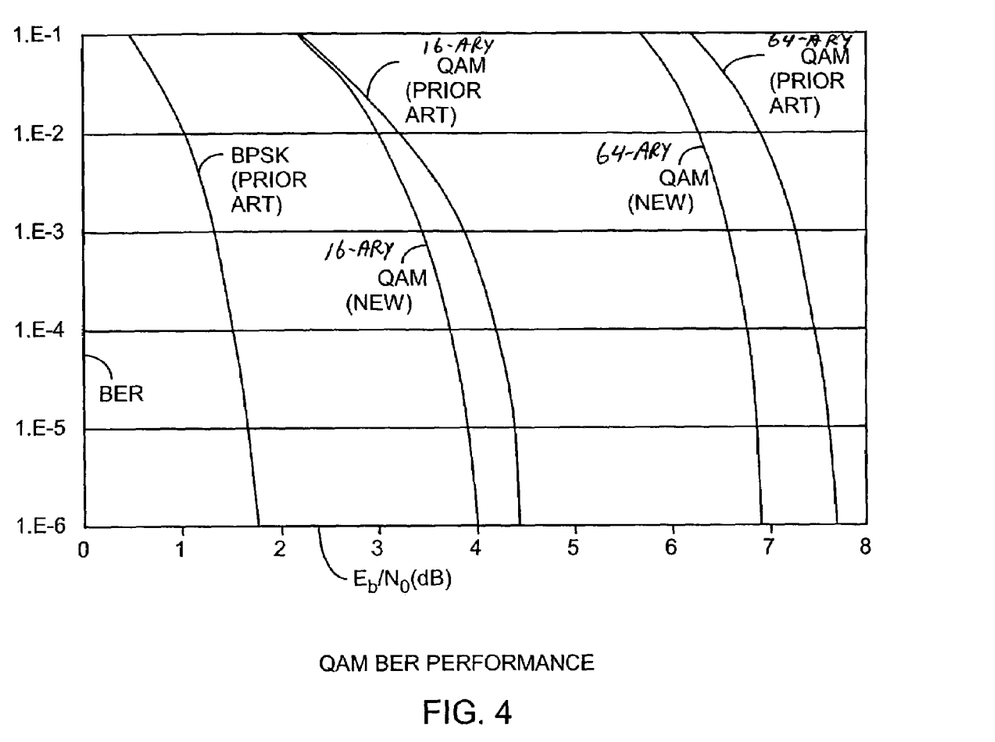
FIG. 4 is a QAM BER performance comparison graph.

FIG. 4 shows the BER performances for 16-ary QAM and 64-ary QAM using the new bit boundary third method as compared to the prior art first method, and as compared to prior art BPSK modulation. The maximum likelihood metric using the first method is the optimum for the uncoded case but does not provide the optimum performance in the coded case. Metric computation using the prior art second method gives a very similar performance to the prior art first method, while the new third bit boundary method always provides superior performance. The advantage of using new third bit boundary method over the first and second methods is 0.25 dB for 16-ary QAM or 0.75 B for 64-ary QAM at a BER of $10^{-6}$. As compared to the uncoded case, the respective coding gains using the third bit boundary method are 10.5 dB for 16-ary QAM and 12.0 dB for 64-ary QAM at a BER of $10^{-6}$. The advantage of using turbo code over a rate 1/2, constraint length 7 convolutional code is 3.0 dB for 16-ary QAM or 3.3 dB for 64-ary QAM. The functions of exponentiation, summation, and logarithm used for computing the soft metric using the first method, as well as the maximization used for computing in the second method, are complicated operations for hardware implementation. The forming of soft metrics from the first and second methods also requires the knowledge of CSI. An inaccurate value of CSI will result in an incorrect soft metric and in turn will cause additional performance degradation. Hence, the new third bit boundary method based on bit boundaries is preferred, and only requires simple computational operations, does not require CSI computation, and presents a computational advantage over the first and second methods.

The new third bit boundary method can also be applied when using PSK modulation. For PSK signal constellation using the PSK symbol constellation, for examples and as shown in FIGS. 3A and 3B, and for any demodulated received signal $[r^{(i)}k, r^{(q)}k]$, the symbol that was most likely transmitted is the one with the smallest angular separation or the greatest cosinusoidal value of the angular separation. Therefore, the soft metric considered can be formed using soft metric polar equation that does not require CSI information.

$$\Lambda_k(n) = \underset{j=1;a_n=1}{\overset{M}{\text{MAX}}} \left(r^{(i)}_k \cdot x(j) + r^{(q)}_k \cdot y(j)\right)$$

$$- \underset{j=1;a_n=0}{\overset{M}{\text{MAX}}} \left(r^{(i)}_k \cdot x(j) + r^{(q)}_k \cdot y(j)\right)$$

From the signal constellation space shown in FIGS. 3A and 3B, all received symbol points have unity intensity and are equiangularly and circumferentially disposed about the center 0,0 location of the symbol constellation space, as shown. By way of example, for 8-ary PSK there are eight points, and for 16-ary PSK there are sixteen points, as shown. The angular boundary lines are shown in polar form as radiating from the center location and having a bit boundary angle $\beta$ that uniquely defines the angular boundary line. As such, all bit boundary lines extend from the center location at a respective angle $\beta$. Similar to using QAM, the angular boundary lines separate $a_i$ bits into $bit_{i-0}$ and $bit_{i-1}$ groups of bits of zeros and ones. The boundary line angle $\beta$ is a function of a minimum angle $\alpha$ where $\alpha=2\pi/M$ and is the minimum angular separation between two adjacent signals on the signal constellation space. In the case of 8-ary PSK, where M=8, the minimum angle $\alpha$ is $2\pi/8$ or $\alpha=\pi/4=45°$. In the case of 16-ary PSK, the minimum angle $\alpha=2\pi/16$ or $\alpha=\pi/8=22.5°$ degrees. The shortest Euclidean distance from a received signal point in the symbol constellation space to an angular boundary line again represents the soft metrics as reliability information for the corresponding bit especially in the high SNR case. With proper signs, the shortest distances can be efficiently computed as bitwise soft metrics. The shortest distance extends along a line that is perpendicular to the angular boundary line and extends between the received signal point to the closest angular boundary line.

For 8-ary PSK, the minimum angle $\alpha$ is $\pi/4$. The $bit_1$ boundary lines for bit $a_1$ are $\beta=\pm2\alpha=\pm\pi/2$ for separating the $bit_{1-0}$ group of zero bit values for the bit $a_1$ and the $bit_{1-1}$ group of one bit values for the bit $a_1$. The $bit_2$ boundary lines are at $\beta=2\alpha\pm2\alpha=(\pi/2)\pm(\pi/2)=\pi;0$, for separating the $bit_{2-0}$ group of zero bit values for the bit $a_2$ and the $bit_{2-1}$ group of one bit values for the bit $a_2$. The $bit_3$ boundary lines are at $\beta=\pm\alpha=\pm\pi/4$ and $\beta=\pm3\alpha=\pm3\pi/4$ for separating the $bit_{3-0}$ group of zero bit values for the bit $a_3$ and the $bit_{3-1}$ group of one bit values for the bit $a_3$.

A soft metric is the shortest distance from the received signal to the $bit_i$ boundary lines associated with a respective bit $a_i$. There are respective distances from the received point to respective boundary lines. The shortest distance to the closet boundary line is the distance used, that is, the soft metric. For generating closed form bitwise soft metric equations, the received point defines a phase angle $\gamma$ where $\gamma=\tan^{-1}(r^{(q)}_k/r^{(i)}_k)$. The phase angle $\gamma$ is the phase angle of the received signal $(r^{(i)}_k, r^{(q)}_k)$, that is, the polar angle of the received signal in the symbol constellation space. The phase angle γ can be used to efficiently compute the soft metric as shown in an 8-ary PSK soft metrics computation table.

| 8-ary PSK Soft Metrics Computation Table | | |
|---|---|---|
| $\Lambda_k(1) =$ | $+[r^{(q)}_k \cos(2\alpha) - r^{(i)}_k \sin(2\alpha)]$ | $= -r^{(i)}_k$ |
| $\Lambda_k(2) =$ | $-[r^{(q)}_k \cos(0) - r^{(i)}_k \sin(0)]$ | $= -r^{(q)}_k$ |
| $\Lambda_k(3) =$ | $+[r^{(q)}_k \cos(\alpha) - r^{(i)}_k \sin(\alpha)]$ | if $\alpha - \alpha \leq \gamma < \alpha + \alpha$ |
| or | $-[r^{(q)}_k \cos(3\alpha) - r^{(i)}_k \sin(3\alpha)]$ | if $3\alpha - \alpha \leq \gamma < 3\alpha + \alpha$ |
| or | $+[r^{(q)}_k \cos(5\alpha) - r^{(i)}_k \sin(5\alpha)]$ | if $5\alpha - \alpha \leq \gamma < 5\alpha + \alpha$ |
| or | $-[r^{(q)}_k \cos(7\alpha) - r^{(i)}_k \sin(7\alpha)]$ | if $7\alpha - \alpha \leq \gamma < 7\alpha + \alpha$ |
| $\Lambda_k(3) =$ | $+[r^{(q)}_k \cos(\pi/4) - r^{(i)}_k \sin(\pi/4)]$ | if $0 \leq \gamma < \pi/2$ |
| or | $-[r^{(q)}_k \cos(3\pi/4) - r^{(i)}_k \sin(3\pi/4)]$ | if $\pi/2 \leq \gamma < \pi$ |
| or | $+[r^{(q)}_k \cos(5\pi/4) - r^{(i)}_k \sin(5\pi/4)]$ | if $\pi \leq \gamma < 3\pi/2$ |
| or | $-[r^{(q)}_k \cos(7\pi/4) - r^{(i)}_k \sin(7\pi/4)]$ | if $3\pi/2 \leq \gamma < 2\pi$ |

For 16-ary PSK, the minimum angle α is π/8. The $bit_1$ boundary lines for bit $a_1$ are $\beta = \pm 4\alpha = \pm \pi/2$ for separating the $bit_{1-0}$ group of zero bit values for the bit $a_1$ and the $bit_{1-1}$ group of one bit values for the bit $a_1$. The $bit_2$ boundary lines are at $\beta = 4\alpha \pm 4\alpha = (\pi/2) \pm (\pi/2)$, for separating the $bit_{2-0}$ group of zero bit values for the bit $a_2$ and the $bit_{2-1}$ group of one bit values for the bit $a_2$. The $bit_3$ boundary lines are at $\beta = \pm 2\alpha = \pm \pi/4$ and $\beta = \pm 6\alpha = \pm 3\pi/4$ for separating the $bit_{3-0}$ group of zero bit values for the bit $a_3$ and the $bit_{3-1}$ group of one bit values for the bit $a_3$. The $bit_4$ boundary lines are at $\beta = \pm \alpha = \pm \pi/8$, $\beta = 4\alpha \pm \alpha = (\pi/2) \pm (\pi/8)$, $\beta = 8\alpha \pm \alpha = \pi \pm \pi/8$, and $\beta = 12\alpha \pm \alpha = (3\pi/2) \pm (\pi/8)$ for separating the $bit_{4-0}$ group of zero bit values for the bit $a_4$ and the $bit_{4-1}$ group of one bit values for the bit $a_4$. The soft metrics computations for 16-ary PSK are listed in a 16-ary PSK soft metrics computation table.

| 16-ary PSK Soft Metrics Computation Table | | |
|---|---|---|
| $\Lambda_k(1) =$ | $+[r^{(q)}_k \cos(4\alpha) - r^{(i)}_k \sin(4\alpha)]$ | $= -r^{(i)}_k$ |
| $\Lambda_k(2) =$ | $-[r^{(q)}_k \cos(0) - r^{(i)}_k \sin(0)]$ | $= -r^{(q)}_k$ |
| $\Lambda_k(3) =$ | $+[r^{(q)}_k \cos(2\alpha) - r^{(i)}_k \sin(2\alpha)]$ | if $2\alpha - 2\alpha \leq \gamma < 2\alpha + 2\alpha$ |
| or | $-[r^{(q)}_k \cos(6\alpha) - r^{(i)}_k \sin(6\alpha)]$ | if $6\alpha - 2\alpha \leq \gamma < 6\alpha + 2\alpha$ |
| or | $+[r^{(q)}_k \cos(10\alpha) - r^{(i)}_k \sin(10\alpha)]$ | if $10\alpha - 2\alpha \leq \gamma < 10\alpha + 2\alpha$ |
| or | $-[r^{(q)}_k \cos(14\alpha) - r^{(i)}_k \sin(14\alpha)]$ | if $14\alpha - 2\alpha \leq \gamma < 14\alpha + 2\alpha$ |
| $\Lambda_k(3) =$ | $+[r^{(q)}_k \cos(\pi/4) - r^{(i)}_k \sin(\pi/4)]$ | if $0 \leq \gamma < \pi/2$ |
| or | $-[r^{(q)}_k \cos(3\pi/4) - r^{(i)}_k \sin(3\pi/4)]$ | if $\pi/2 \leq \gamma < \pi$ |
| or | $+[r^{(q)}_k \cos(5\pi/4) - r^{(i)}_k \sin(5\pi/4)]$ | if $\pi \leq \gamma < 3\pi/2$ |
| or | $-[r^{(q)}_k \cos(7\pi/4) - r^{(i)}_k \sin(7\pi/4)]$ | if $3\pi/2 \leq \gamma < 2\pi$ |
| $\Lambda_k(4) =$ | $+[r^{(q)}_k \cos(\alpha) - r^{(i)}_k \sin(\alpha)]$ | if $\alpha - \alpha \leq \gamma < \alpha + \alpha$ |
| or | $-[r^{(q)}_k \cos(3\alpha) - r^{(i)}_k \sin(3\alpha)]$ | if $3\alpha - \alpha \leq \gamma < 3\alpha + \alpha$ |
| or | $+[r^{(q)}_k \cos(5\alpha) - r^{(i)}_k \sin(5\alpha)]$ | if $5\alpha - \alpha \leq \gamma < 5\alpha + \alpha$ |
| or | $-[r^{(q)}_k \cos(7\alpha) - r^{(i)}_k \sin(7\alpha)]$ | if $7\alpha - \alpha \leq \gamma < 7\alpha + \alpha$ |
| or | $+[r^{(q)}_k \cos(9\alpha) - r^{(i)}_k \sin(9\alpha)]$ | if $9\alpha - \alpha \leq \gamma < 9\alpha + \alpha$ |
| or | $-[r^{(q)}_k \cos(11\alpha) - r^{(i)}_k \sin(11\alpha)]$ | if $11\alpha - \alpha \leq \gamma < 11\alpha + \alpha$ |
| or | $+[r^{(q)}_k \cos(13\alpha) - r^{(i)}_k \sin(13\alpha)]$ | if $13\alpha - \alpha \leq \gamma < 13\alpha + \alpha$ |
| or | $-[r^{(q)}_k \cos(15\alpha) - r^{(i)}_k \sin(15\alpha)]$ | if $15\alpha - \alpha \leq \gamma < 15\alpha + \alpha$ |
| $\Lambda_k(4) =$ | $+[r^{(q)}_k \cos(\pi/8) - r^{(i)}_k \sin(\pi/8)]$ | if $0 \leq \gamma < \pi/4$ |
| or | $-[r^{(q)}_k \cos(3\pi/8) - r^{(i)}_k \sin(3\pi/8)]$ | if $\pi/4 \leq \gamma < \pi/2$ |
| or | $+[r^{(q)}_k \cos(5\pi/8) - r^{(i)}_k \sin(5\pi/8)]$ | if $\pi/2 \leq \gamma < 3\pi/4$ |
| or | $-[r^{(q)}_k \cos(7\pi/8) - r^{(i)}_k \sin(7\pi/8)]$ | if $3\pi/4 \leq \gamma < \pi$ |
| or | $+[r^{(q)}_k \cos(9\pi/8) - r^{(i)}_k \sin(9\pi/8)]$ | if $\pi \leq \gamma < 5\pi/4$ |
| or | $-[r^{(q)}_k \cos(11\pi/8) - r^{(i)}_k \sin(11\pi/8)]$ | if $5\pi/4 \leq \gamma < 3\pi/2$ |
| or | $+[r^{(q)}_k \cos(13\pi/8) - r^{(i)}_k \sin(13\pi/8)]$ | if $3\pi/2 \leq \gamma < 7\pi/4$ |
| or | $-[r^{(q)}_k \cos(15\pi/8) - r^{(i)}_k \sin(15\pi/8)]$ | if $7\pi/4 \leq \gamma < 2\pi$ |

As may be apparent, the soft metrics are computed based only on the received signal and minimum angle α using a closed form equation for efficient computation of the soft metrics.

The computation of the soft metrics for M-ary PSK can be generalized. For M-ary PSK, where $M = 2^L$ and $\alpha = 2\pi/M$, a general form of the soft metrics equations are listed in a M-ary PSK soft metrics computation table.

| M-ary PSK Soft Metrics Computation Table | | |
|---|---|---|
| $\Lambda_k(1) =$ | $+[r^{(q)}_k \cos(M\alpha/4) - r^{(i)}_k \sin(M\alpha/4)]$ | $= -r^{(i)}_k$ |
| $\Lambda_k(2) =$ | $-[r^{(q)}_k \cos(0) - r^{(i)}_k \sin(0)]$ | $= -r^{(q)}_k$ |
| $\Lambda_k(L) =$ | $+[r^{(q)}_k \cos(\alpha) - r^{(i)}_k \sin(\alpha)]$ | if $\alpha - \alpha \leq \gamma < \alpha + \alpha$ |
| or | $-[r^{(q)}_k \cos(3\alpha) - r^{(i)}_k \sin(3\alpha)]$ | if $3\alpha - \alpha \leq \gamma < 3\alpha + \alpha$ |
| or | $+[r^{(q)}_k \cos(5\alpha) - r^{(i)}_k \sin(5\alpha)]$ | if $5\alpha - \alpha \leq \gamma < 5\alpha + \alpha$ |
| ... | | |
| or | $-[r^{(q)}_k \cos((M-3)\alpha) - r^{(i)}_k \sin((M-3)\alpha)]$ | if $(M-3)\alpha - \alpha \leq \gamma < 2(M-3)\alpha + \alpha$ |
| or | $-[r^{(q)}_k \cos((M-1)\alpha) - r^{(i)}_k \sin((M-1)\alpha)]$ | if $(M-1)\alpha - \alpha \leq \gamma < 2(M-1)\alpha + \alpha$ |
| $\Lambda_k(L-1) =$ | $+[r^{(q)}_k \cos(2\alpha) - r^{(i)}_k \sin(2\alpha)]$ | if $2\alpha - 2\alpha \leq \gamma < 2\alpha + 2\alpha$ |
| or | $-[r^{(q)}_k \cos(6\alpha) - r^{(i)}_k \sin(6\alpha)]$ | if $6\alpha - 2\alpha \leq \gamma < 6\alpha + 2\alpha$ |
| or | $+[r^{(q)}_k \cos(10\alpha) - r^{(i)}_k \sin(10\alpha)]$ | if $10\alpha - 2\alpha \leq \gamma < 10\alpha + 2\alpha$ |
| ... | | |
| or | $+[r^{(q)}_k \cos(2(M-3)\alpha) - r^{(i)}_k \sin(2(M-3)\alpha)]$ | if $2(M-3)\alpha - 2\alpha \leq \gamma < 2(M-3)\alpha + 2\alpha$ |
| or | $-[r^{(q)}_k \cos(2(M-1)\alpha) - r^{(i)}_k \sin(2(M-1)\alpha)]$ | if $2(M-1)\alpha - 2\alpha \leq \gamma < 2(M-1)\alpha + 2\alpha$ |
| $\Lambda_k(L-t)_{\text{(for } t<L-2\text{)}} =$ | $+[r^{(q)}_k \cos(2^t\alpha) - r^{(i)}_k \sin(2^t\alpha)]$ | if $2^t\alpha - 2^t\alpha \leq \gamma < 2^t\alpha + 2^t\alpha$ |
| or | $-[r^{(q)}_k \cos(2^t 3\alpha) - r^{(i)}_k \sin(2^t 3\alpha)]$ | if $2^t 3\alpha - 2^t\alpha \leq \gamma < 2^t 3\alpha + 2^t\alpha$ |
| or | $+[r^{(q)}_k \cos(2^t 5\alpha) - r^{(i)}_k \sin(2^t 5\alpha)]$ | if $2^t 5\alpha - 2^t\alpha \leq \gamma < 2^t 5\alpha + 2^t\alpha$ |
| ... | | |
| or | $+[r^{(q)}_k \cos(2^t(M-3)\alpha) - r^{(i)}_k \sin(2^t(M-3)\alpha)]$ | if $2^t(M-3)\alpha - 2^t\alpha \leq \gamma < 2^t(M-3)\alpha + 2^t\alpha$ |
| or | $+[r^{(q)}_k \cos(2^t(M-1)\alpha) - r^{(i)}_k \sin(2^t(M-1)\alpha)]$ | if $2^t(M-1)\alpha - 2^t\alpha \leq \gamma < 2^t(M-1)\alpha + 2^t\alpha$ |

Figure 5:
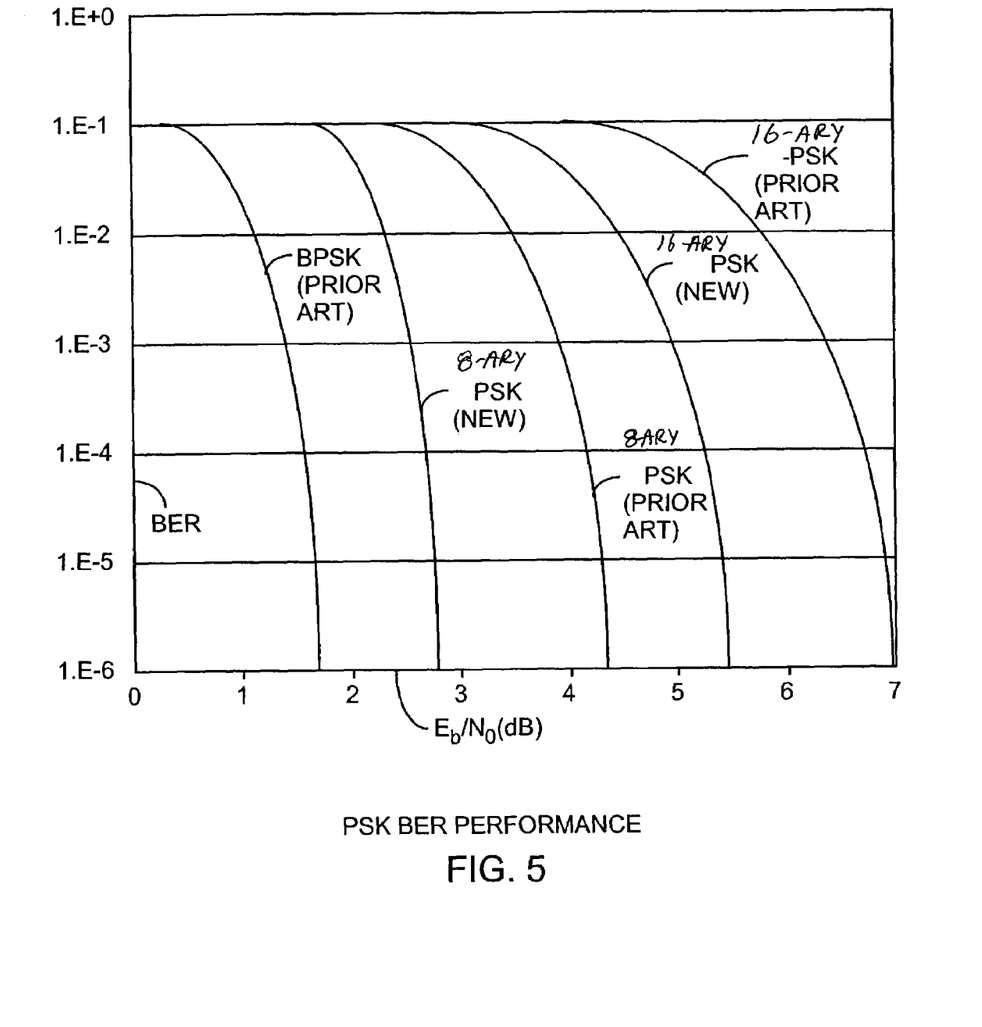
FIG. 5 is a PSK BER performance comparison graph.

FIG. 5 shows the BER performance for 8-ary PSK and 16-ary PSK for the new bit boundary third method as compared to the prior art first method and prior art BPSK modulation. The BER performances in additive white Gaussian noise channel results from the decoding metrics for 8-ary PSK and 16-ary PSK. Ten iterations are used during turbo decoding prior to making hard decisions about the information sequence. To ensure an accurate estimation of BER values, a minimum of 500 bit errors are accumulated at each operating point of the simulation. The simulations indicate that the maximum likelihood metric, which is the optimum for the prior art uncoded case, provides the worst BER performance among three methods discussed. The prior art first and second methods essentially provide a fixed improvement of 0.5 dB for 8-ary PSK and 1.25 dB for 16-ary PSK in an average white Gaussian noise channel over the entire operating region of Eb/N0. The new third bit boundary method always provides the best performance in an average white Gaussian noise channel. The new third bit boundary method also shows improved performance in fading channels. The advantage of using the new third method over the first and second methods is 1.0 dB for 8-ary PSK or 1.5 dB for 16-ary PSK in the average Gaussian noise channel case at a BER of 106. This advantage is reduced to around 0.7 dB in the fading case for both 8-ary PSK and 16-ary PSK. As compared to the uncoded case, the respective coding gains using the new third bit boundary method are 10.5 dB for 8-ary PSK and 12.5 dB for 16-ary PSK at a BER of $10^{-6}$ for an average white Gaussian noise channel.

The metrics generator is used for computing soft metrics, but in the case of the prior art first and second methods, the operations are complicated, time-consuming, and inefficient. The preferred third bit boundary method requires only the received signal and minimum angle $\alpha$. Additionally, the first and second methods also require knowledge of CSI. An inaccurate value of CSI will result in an incorrect soft metric that will in turn cause additional performance degradation. This requirement of accurate CSI imposes a disadvantage not found in the third bit boundary method. Hence, the adoption of third bit boundary method does not require CSI knowledge and presents computational advantages. The spectral efficiencies can be achieved for symbol waveforms of 1.5 bits/symbol when 8-ary PSK is used, and, 2.0 bits/symbol when 16-ary PSK is used. A degradation of 1.0 dB occurs when using rate 2/3 as opposed to rate 1/2 turbo code. Applying this 1.0 dB degradation when rate 2/3 turbo code is used, the required $E_b/N_0$ is 4.3 dB for 8-ary PSK at 2.0 bits/symbol, or 6.5 dB for 16-ary PSK at 3.0 bits/symbol, respectively, in order to achieve a BER of $10^{-6}$.

The present invention is directed to bit boundary computation methods of computing turbo decoding soft metrics at the output of the QAM or PSK demodulator. The preferred third bit boundary method only requires the simple computation from the receive signal values and performs with improved BER. The turbo-coded gray scale mapped and modulated waveforms provide similar performances to turbo trellis coded modulation based on the same interleaver size, and the same bandwidth efficiency, and the number of information bits per channel symbol. While the preferred-form is directed to normalized minimum distances $\delta$ and angles $\alpha$, and directed to gray scale mapping, the invention is generally applicable to any signal constellation space, applicable to any M-ary QAM or PSK modulation, applicable to any arbitrary turbo code, applicable to any type of mapping, to any arbitrary boundary lines, provided that the boundary lines separate groups of zero and one bit values for bitwise metric computation based on the computed shortest distance from the received point to a boundary line that extends in whole or in part through the signal constellation space. The new third method does not require new development of a new turbo codec. Although some turbo trellis code modulation schemes use a code structure of eight states, which is less complicated than the one used in the new third method, it is well known that the commonly used turbo codes with 8 states and 16 states perform essentially the same at a BER above $10^{-6}$. Therefore, a new third bit boundary method turbo code system provides a viable alternative to a turbo trellis coded modulation system. Those skilled in the art can make enhancements, improvements, and modifications to the invention, and these enhancements, improvements, and modifications may nonetheless fall within the spirit and scope of the following claims.

What is claimed is:

1. A system for communicating channel symbols, the system comprising,
   a turbo encoder for turbo encoding input data into turbo encoded data,
   a mapper for mapping the turbo encoded data into mapped data defining symbols of $a_i$ bits, the mapping serving to define boundary lines within a symbol constellation space of the symbols, the constellation signal space is a quadrature signal constellation space having a horizontal inphase i-axis and a vertical quadrature q-axis, the boundary lines being defined by i-axis and q-axis values, the boundary lines being lines extending through the symbol constellation space for bitwise separating zero and one bit values into respective $bit_{i-0}$ and $bit_{i-1}$ groups, a modulator for modulating the mapped data into channel symbols within the symbol constellation space, the modulator serving to communicate the channel symbols across a communication channel,
   a demodulator for M-ary demodulating each of the channel symbols into respective received signals where $M=2^L$, the received signals have an inphase component $r^{(i)}$ and a quadrature component $r^{(q)}$, where L is the number of bits in a channel symbol,
   a soft metrics generator for generating bitwise soft metrics $\Lambda(i)$ for each bit $a_i$ from each of the received signals, each of the bitwise soft metrics being a shortest distance from the received signal to one of the bitwise $bit_i$ boundary lines, and
   a turbo decoder for decoding the bitwise soft metrics into an estimate of the input data.

2. The system of claim 1 wherein,
   the modulator is a quadrature amplitude modulator (QAM).

3. The system of claim 1 wherein,
   the modulator is a quadrature amplitude modulator (QAM), and
   M=16 for 16-ary QAM communications.

4. The system of claim 1 wherein,
   the modulator is a quadrature amplitude modulator (QAM), and
   M is equal 64 for 64-ary QAM communications.

5. A system for communicating channel symbols, the system comprising,
   a turbo encoder for turbo encoding input data into turbo encoded data,
   a gray scale mapper for gray scale mapping the turbo encoded data into gray scale mapped data defining gray scale symbols of $a_i$ bits, the gray scale mapping serving to define boundary lines within a symbol constellation space of the gray scale symbols, the constellation signal space is a quadrature signal constellation space having a horizontal inphase i-axis and a vertical quadrature q-axis, the constellation signal space defining a normalized minimum distance δ, the boundary lines being defined by i-axis and q-axis values that are a function of the normalized minimum distance δ, the boundary lines being horizontal and vertical lines extending through the symbol constellation space for bitwise separating zero and one bit values into respective $bit_{i\text{-}0}$ and $bit_{i\text{-}1}$ groups, a modulator for modulating the gray scale mapped data into channel symbols within the symbol constellation space, the modulator serving to communicate the channel symbols across a communication channel, a demodulator for M-ary demodulating each of the channel symbols into respective received signals where $M=2^L$ where L is a number of bits in the channel symbols, the received signals have an inphase component $r^{(i)}$ and a quadrature component $r^{(q)}$, a soft metrics generator for generating bitwise soft metrics Λ(i) for each bit $a_i$ from each of the received signals, each of the bitwise soft metrics being a shortest distance from the received signal to one of the bitwise $bit_i$ boundary lines, and a turbo decoder for decoding the bitwise soft metrics into an estimate of the input data.

6. The system of claim 5 wherein,
the modulator is a quadrature amplitude modulator (QAM).

7. The system of claim 5 wherein,
the modulator is a quadrature amplitude modulator (QAM), and
M=16 for 16-ary QAM communications.

8. The system of claim 5 wherein,
the modulator is a quadrature amplitude modulator (QAM),
M=16 for 16-ary QAM communications, and
the normalized minimum distance δ is $1/\sqrt{10}$.

9. The system of claim 5 wherein,
the modulator is a quadrature amplitude modulator (QAM),
M=16 for 16-ary QAM communications,
the normalized minimum distance δ is $1/\sqrt{10}$,
the $bit_1$ boundary lines for bit $a_1$ are q=±0δ or simply q=0 for separating the $bit_{1\text{-}0}$ group of zero bit values for the bit $a_1$ and the $bit_{1\text{-}1}$ group one bit values for the bit $a_1$,
the $bit_2$ boundary lines are at q=±2δ for separating the $bit_{2\text{-}0}$ group of zero bit values for the bit $a_2$ and the $bit_{2\text{-}1}$ group one bit values for the bit $a_2$,
the $bit_3$ boundary lines are at i=±0δ for separating the $bit_{3\text{-}0}$ group of zero bit values for the bit $a_3$ and the $bit_{3\text{-}1}$ group one bit values for the bit $a_3$, and
the $bit_4$ boundary lines are at i=±2δ for separating the $bit_{4\text{-}0}$ group of zero bit values for the bit $a_4$ and the $bit_{4\text{-}1}$ group one bit values for the bit $a_2$.

10. The system of claim 5 wherein,
the modulator is a quadrature amplitude modulator (QAM),
M is equal 16 for 16-ary QAM communications,
the normalized minimum distance δ is $1/\sqrt{10}$, where $\sqrt{}$ is a square root,
the soft metric $\Lambda(1)=-r^{(q)}$,
the soft metric $\Lambda(2)=2/\sqrt{10}-|r^{(q)}|$, where | | is an absolute value,
the soft metric $\Lambda(3)=r^{(i)}$, and
the soft metric $\Lambda(4)=2/\sqrt{10}-|r^{(i)}k|$.

11. The system of claim 5 wherein,
the modulator is a quadrature amplitude modulator (QAM), and
M is equal 64 for 64-ary QAM communications.

12. The system of claim 5 wherein,
the modulator is a quadrature amplitude modulator (QAM),
M is equal 64 for 64-ary QAM communications, and
the normalized minimum distance δ is $1/\sqrt{42}$.

13. The system of claim 5 wherein,
the modulator is a quadrature amplitude modulator (QAM),
M is equal 64 for 64-ary QAM communications,
the normalized minimum distance δ is $1/\sqrt{42}$, and
the $bit_1$ boundary lines for bit $a_1$ are q=±0δ or simply q=0 for separating the $bit_{1\text{-}0}$ group of zero bit values for the bit $a_1$ and the $bit_{1\text{-}1}$ group one bit values for the bit $a_1$,
the $bit_2$ boundary lines are at q=±4δ for separating the $bit_{2\text{-}0}$ group of zero bit values for the bit $a_2$ and the $bit_{2\text{-}1}$ group one bit values for the bit $a_2$,
the $bit_3$ boundary lines are at q=±2δ and q=±6δ for separating the $bit_{3\text{-}0}$ group of zero bit values for the bit $a_3$ and the $bit_{3\text{-}1}$ group one bit values for the bit $a_3$,
the $bit_4$ boundary lines are at i=±0δ or simply i=0 for separating the $bit_{4\text{-}0}$ group of zero bit values for the bit $a_4$ and the $bit_{4\text{-}1}$ group one bit values for the bit $a_2$,
the $bit_5$ boundary lines are at i=±4δ for separating the $bit_{5\text{-}0}$ group of zero bit values for the bit $a_5$ and the $bit_{5\text{-}1}$ group one bit values for the bit $a_2$, and
the $bit_6$ boundary lines are at i=±2δ and i=±6δ for separating the $bit_{6\text{-}0}$ group of zero bit values for the bit $a_6$ and the $bit_{6\text{-}1}$ group one bit values for the bit $a_6$.

14. The system of claim 5 wherein,
the modulator is a quadrature amplitude modulator (QAM),
M is equal 64 for 64-ary QAM communications,
the normalized minimum distance δ is $1/\sqrt{10}$, where $\sqrt{}$ is a square root, and
the soft metric $\Lambda(1)=-r^{(q)}$,
the soft metric $\Lambda(2)=4\sqrt{42}-|r^{(q)}|$, where | | is an absolute value,
the soft metric $\Lambda(3)=2\sqrt{42}-||r^{(q)}|-4\sqrt{42}|$,
the soft metric $\Lambda(4)=r^{(i)}$,
the soft metric $\Lambda(5)=4\sqrt{42}-|r^{(i)}|$, and
the soft metric $\Lambda(6)=2\sqrt{42}-||r^{(i)}|-4\sqrt{42}|$.

* * * * *